(12) United States Patent
Abusch-Magder et al.

(10) Patent No.: US 6,531,751 B1
(45) Date of Patent: Mar. 11, 2003

(54) SEMICONDUCTOR DEVICE WITH INCREASED GATE INSULATOR LIFETIME

(75) Inventors: David Abusch-Magder, Maplewood, NJ (US); Jeffrey Devin Bude, New Providence, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/271,084

(22) Filed: Mar. 17, 1999

Related U.S. Application Data
(60) Provisional application No. 60/110,711, filed on Dec. 3, 1998.

(51) Int. Cl.⁷ ............................................. H01L 29/76
(52) U.S. Cl. ........................ 257/412; 257/77; 257/316
(58) Field of Search ........................... 257/410, 411, 257/412, 413, 77, 76, 315, 316

(56) References Cited

U.S. PATENT DOCUMENTS

| | | | |
|---|---|---|---|
| 3,673,471 A | | 6/1972 | Klein et al. .................. 317/235 |
| 4,507,673 A | | 3/1985 | Aoyama et al. |
| 4,980,303 A | * | 12/1990 | Yamauchi .................... 437/31 |
| 5,307,305 A | | 4/1994 | Takasu ........................ 365/145 |
| 5,734,181 A | * | 3/1998 | Ohba et al. .................... 257/77 |
| 5,801,401 A | | 9/1998 | Forbes ........................ 257/777 |
| 5,886,368 A | * | 3/1999 | Forbes et al. ................. 257/77 |
| 6,031,263 A | * | 2/2000 | Forbes et al. ................ 257/315 |

FOREIGN PATENT DOCUMENTS

JP  03222367  1/1990  ......... H01L/29/784

OTHER PUBLICATIONS

Onda, et al. *Phys, Stat. Sol.* (a) 162, "SiC Integrated MOSFETS", pp. 369–388, (1997).

Itoh et al., *Critical Reviews in Solid State and Materials Sciences*, "Single Crystal Growth of SiC and Electronic Devices", vol. 22, No. 2, pp. 111–197, (1997).

* cited by examiner

*Primary Examiner*—Sara Crane
(74) *Attorney, Agent, or Firm*—Richard J. Botos

(57) ABSTRACT

A semiconductor device in which hole-induced damage to the dielectric layer is reduced is disclosed. In the device, a layer of a conductive, high bandgap (i.e. a material with a bandgap greater than 1.1 eV) material is formed adjacent to the dielectric layer. The presence of the high bandgap material reduces the hole-induced damage to the dielectric layer that occurs during device operation compared to devices in which the conductive material adjacent to the dielectric is silicon.

4 Claims, 2 Drawing Sheets

SEMICONDUCTOR DEVICE WITH INCREASED GATE INSULATOR LIFETIME

CROSS-REFERENCE TO RELATED APPLICATION

This application claims priority of Provisional Application Ser. No. 60/110,711 which was filed Dec. 3, 1998.

BACKGROUND OF THE INVENTION

1. Technical Field

The present invention is directed to a semiconductor device and a process for fabricating the device.

2. Art Background

A number of semiconductor devices have a structure in which two electrodes are separated by a layer of dielectric material. For example, a MOSFET (metal-oxide-semiconductor field effect transistor) device is a voltage-controlled device that has a channel region linking two electrically-separated, highly conductive regions of a first conductivity type diffused into an opposite conductivity type semiconductor substrate. When a voltage that is above a certain threshold voltage ($V_{TH}$) is applied to a gate electrode overlying but insulated from the channel region by a gate dielectric material, current flows from one highly conductive region (the source) to the second highly conductive region (the drain).

The voltage that is applied to the device causes one electrode (the cathode) to inject electrons across the dielectric layer and into the other electrode (the anode). One skilled in the art will understand that, in these devices, whether an electrode functions as an anode or a cathode depends upon the conditions (i.e. the direction of electron flow) under which the device is operated. It is also understood that the electrodes are electrically conductive in that they contain free carriers.

The electrons are injected into the anode with high energies (i.e. energies that are above the conduction band edge of the anode material). Such high energies are typically above about 0.2 eV. The electron injection energy ($E_j$) is defined herein with respect to the conduction band edge of the anode material. High-energy electrons in the anode undergo impact ionization, which creates holes. Electron impact ionization is the process in which a high-energy electron collides with a valence electron. This collision promotes the valence electron into a higher energy empty state either in the valence band or the conduction band. The promotion of the valence electron leaves behind an energetic hole in the valence band. An energetic hole has an energy that is typically 0.2 eV greater than the valence band edge in the anode material. As defined herein, hole injection or anode injection refer to energetic hole injection from the anode into the dielectric material. Thus the product of impact ionization is at least one energetic hole. The rate of impact ionization is a strong function of $E_j$ (decreasing as $E_j$ decreases) and of the band gap of the anode material (decreasing as the band gap increases).

When such energetic holes are generated in the anode, there is a tendency for the holes to be injected from the anode, into the dielectric layer. Hole injection into the gate dielectric from the anode has been observed to damage the dielectric layer. When holes are injected into the dielectric layer, they cause the properties of the dielectric layer to change. Such changes in the dielectric material include an increase in the number of interface states, an increase in the trapped charge, an increased number of leakage sites, and mechanical and chemical changes. Such changes potentially degrade the device performance in a variety of ways. Such degradation is manifested by reduced subthreshold slope, transconductance degradation, stress induced leakage current, threshold voltage drift ($V_{TH}$ drift) and dielectric breakdown. Since devices are designed to operate with specific characteristics, these changes can compromise device performance and eventually may cause device failure. Accordingly, devices in which the gate dielectric is less susceptible to damage are sought.

SUMMARY OF THE INVENTION

The present invention is directed to a semiconductor device in which a dielectric material is interposed between two electrodes. Examples of such devices include active devices such as metal oxide semiconductor field effect transistors (MOSFET), charge-coupled devices, and floating gate memory devices (e.g. EEPROM devices) and passive devices such as capacitors. The device of the present invention is designed to reduce the amount of damage to the dielectric material of the device during device operation. By reducing the amount of damage to the dielectric material over time, the lifetime of the device is extended.

As previously noted, dielectric damage has been correlated to the injection of holes into the dielectric material from the anode. The present invention is a semiconductor device wherein the number of holes that penetrate the dielectric (typically $SiO_2$) material is reduced (compared to prior art devices) over time. The rate at which the dielectric is damaged by hole penetration is commensurately reduced. The number of holes that penetrate the dielectric are controlled by selecting an electrode material that does one or more of the following: 1.) reduces the number of electrons incident from the cathode to the anode; 2.) reduces the probability that electrons incident on the anode will produce holes by undergoing impact ionization; and 3.) reduces the total energy of the holes produced by impact ionization (thereby decreasing the probability that the holes will be injected from the anode into the dielectric material).

This result is accomplished by a layer of material with a bandgap (i.e., the energy difference between the valence band edge and the conduction band edge of the material) higher than that of silicon (i.e. higher than 1.1 eV) that is adjacent to the dielectric layer. The high bandgap material is electrically conductive (i.e., it serves as a conducting electrode containing free carriers). In order for the high bandgap material to have the requisite conductivity, the high bandgap material is doped. The dopant can be either n-type or p-type, depending upon the nature of the materials adjacent to the high bandgap material and other device considerations. The doping results in a high bandgap material having a single conductivity type (either dominated by electrons or holes). In such a material, the majority dopant is either n-type (dominated by electrons) or p-type (dominated by holes). Consequently, the layer of high bandgap material functions as an electrode. Whether the high bandgap material functions as an anode or a cathode depends upon the operating conditions of the device. In the present invention, the electrode with the high band gap material is either the high band gap material alone or a composite electrode that has more than one material layer. In the composite electrode embodiments, the high bandgap material must be the material that is adjacent to (i.e. next to and in contact with) the dielectric layer.

The present invention is directed to any semiconductor device in which the dielectric material is between two electrodes. However, for convenience and clarity, the invention is described in terms of a MOSFET device. In the MOSFET device used for descriptive purposes herein, the dielectric layer is the gate dielectric layer. Thus, applicants refer to a MOSFET devices and gate dielectric layers for example only, and the invention is not to be construed as limited to MOSFET devices or gate dielectric layers.

In a typical MOSFET device, the gate dielectric layer is $SiO_2$. $SiO_2$ is susceptible to damage when penetrated by holes. $SiO_2$ is one of a class of electrically insulating materials that have a relatively large bandgap. Hole penetration into such materials induces the formation of charge traps which, in turn, may cause changes (either structural or electrical) in the material that adversely affect its dielectric properties. Consequently, the present invention is suited for use in any semiconductor device which has a dielectric material that is susceptible to damage when penetrated by holes. In the prior art, the MOSFET gate dielectric layer is formed on a silicon substrate and the electrode formed on top of the gate dielectric layer is typically polycrystalline silicon. The device of the present invention creates an environment that reduces the number of holes that will penetrate the gate dielectric layer by placing a layer of high bandgap material adjacent to the dielectric layer.

In a MOSFET device, the gate dielectric layer is formed on a semiconductor substrate with source and drain regions formed therein. In the MOSFET embodiment of the present invention, the high bandgap material is formed over the gate dielectric layer (i.e. the dielectric layer is between the high bandgap layer and the substrate). The high bandgap material is electrically conductive. The remaining portion of the gate is then formed over the layer of high bandgap material.

DETAILED DESCRIPTION

Figure 1:
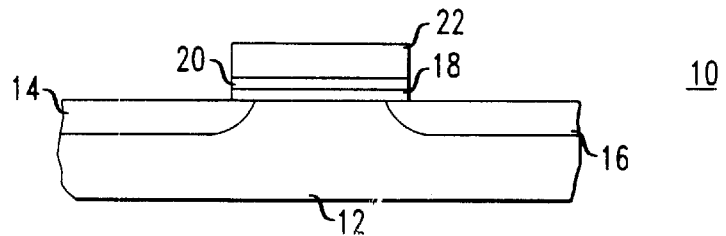
FIG. 1 is a schematic cross-section of a device of the present invention in which a layer of high bandgap material is formed over the gate dielectric layer.

As previously noted, the present invention is directed to a semiconductor device that has a dielectric material layer sandwiched between two electrode materials. A layer of high bandgap material is provided adjacent to the dielectric layer that reduces the damage to the dielectric material during device operation compared to prior art devices. Damage during device operation is attributed at least in part to holes that are injected into the dielectric layer. The dielectric material in the device of the present invention is less susceptible to damage than prior art devices because the high bandgap material reduces the number of holes that are injected into the gate dielectric material compared to prior art devices.

Specifically, the applicants believe that the hole flux ($I_h$) is the product of three factors. The first factor is the number of electrons incident from the cathode to the anode ($I_e$). The second is the probability that the electrons incident on the anode will undergo impact ionization ($P_{ii}$). The third is the probability that the holes in the anode will penetrate the dielectric layer ($T_h$). This relationship is described by the following equation.

$$I_h = I_e P_{ii} T_h$$

Reducing any one of $I_e$, $P_{ii}$, and $T_h$ reduces the hole flux. In general, these variables are functions of the electron injection energy, $E_j$, and of the material properties of the dielectric and the electrode. This is demonstrated by the following definitions of these variables.

$I_e$ depends on the energy barrier between the cathode and the dielectric. Increasing this barrier decreases the number of electrons injected.

$P_{ii}$ is a strong function of the electron energy. For example, when a large density of holes is not present in the anode, a good approximation for the rate of impact ionization for an initial electron of energy $E_j$ yields, $$P_{ii}(E_j) \int dE_3 \int dE_H \rho_C(E_3) \rho_V(E_H) \rho_C(E_j - E_H - E_g - E_3) \quad (1)$$

where $\rho_C(E)$ and $\rho_V(E)$ are total conduction and valence band densities of states. $E_3$ is the energy of the final state of the initial electron, $E_H$ is the energy of the hole produced in the collision with respect to the anode valence band edge, and $E_g$ is the band gap energy. $P_{ii}$ is the probability of a collision between a conduction electron and a valence electron; equation (1) represents the total combined density of states available for the products of that collision (final states) and the density of the initial target valence electrons present. This combined density of states is reduced strongly when $E_j - E_g$ becomes close to zero since the densities of states $\rho_C(E)$ and $\rho_V(E)$ go as $E^{1/2}$ as E approaches zero, and are zero for E<0. Thus, the probability of impact ionization is reduced as the bandgap of the anode increases, and as $E_j$ decreases. Consequently, all other things being equal, a decreased rate of impact ionization occurs in a device with a high bandgap material anode compared to the same device with a silicon anode. The presence of the high bandgap material reduces the number of holes that are created (compared to the same device operated in the same manner but with a silicon anode) that penetrate and, therefore damage the dielectric layer.

$T_h$ is the probability that holes in the anode will penetrate the dielectric (where they can cause damage). $T_h$ decreases strongly (exponentially) with an increasing barrier for holes to enter the dielectric from the anode. $T_h$ is also a strongly increasing function of hole energy, and therefore the larger the maximum energy of holes created in the anode the higher the probability of penetrating the dielectric. The generation probability of a hole of energy $E_H$ due to impact ionization of the initial electron of energy $E_j$ follows from (1) above and is proportional to $$\rho_V(E_H) \int dE_3 \rho_C(E_3) \rho_C(E_j - E_H - E_g E_3). \quad (2)$$

From (2) it follows that the maximum energy of a hole generated in the anode ($E_{MAX}$) is in this case, $$E_{MAX} = E_j - E_g. \quad (3)$$

From (3) it is clear that $E_j$ and $E_g$ directly impact $E_{MAX}$. Reducing $E_j$ or increasing $E_g$ will directly reduce $E_{MAX}$. Since $T_h$ is a strongly increasing function of $E_{MAX}$, reducing $E_j$ or increasing $E_g$ will strongly suppress $I_h$. The presence of the high bandgap material reduces the number of holes that penetrate the dielectric (compared to the same device operated in the same manner but with a silicon anode) and, therefore, damage the dielectric layer.

The material properties of the anode and cathode affect the number of holes injected into the dielectric and hence the dielectric damage rate by affecting the number and energy distribution of holes created in the anode, as detailed above. The effect of the high bandgap material on these factors depends upon both device structure and device operation. The effect of the high bandgap material on these factors is explained by comparing the effect of the high bandgap material with the effect of silicon. The high bandgap material not only has a different bandgap than silicon, its conduction band edge and/or valence band edge are also typically different.

The difference between the band gap of the high bandgap material and the bandgap of silicon is referred to as $\Delta E_g$. For a high bandgap material, X, $\Delta E_g = E_g^X - E_g^{silicon}$. By convention, the $E_g$ for a semiconductor material is positive. A positive $\Delta E_g$ indicates that the high bandgap materials have a bandgap greater than that of silicon.

The conduction band edge is the energy of the lowest energy electron state that is in the conduction band of the material. For purposes of this comparison the difference between the energy of the conduction band edge of the high bandgap material and the conduction band edge of silicon is defined in terms of the electron affinity, $\chi$. The electron affinity, $\chi$, of a material is the difference in energy between the vacuum level and the conduction band edge of the material. This energy is positive when an electron has a lower energy at the conduction band edge than in vacuum. The difference between the conduction band edge of the high bandgap material and that of silicon is the conduction band offset and is designated as $\Delta E_C$. $\Delta E_C$ is the difference between the electron affinity of silicon and the electron affinity of the high bandgap material, X ($\Delta E_C = \chi^{silicon} - \chi^X$)

The valence band edge is the energy of the most energetic electron state that is in the valence band. The difference between the energy of the valence band edge of the high bandgap material and the valence band edge of silicon is referred to as the valence band offset and is designated as $\Delta E_V$. $\Delta E_V$ is also equal to the difference between $\Delta E_g$ and the conduction band offset ($\Delta E_V = \Delta E_g - \Delta E_c$). For a given device having a given dielectric material of a given thickness, and for a given electric field across said dielectric, the high bandgap material provides the following benefits compared with silicon.

If the dielectric-anode interface does not contain holes (for example the n-gate in an n-gate/n-channel device) and the device has a high bandgap material anode adjacent the dielectric layer instead of a silicon anode adjacent thereto, the probability of hole creation ($P_{ii}$) is reduced. The probability is reduced because the bandgap of the anode is increased ($\Delta E_g > 0$) above the bandgap for silicon. Also, if $\Delta E_C > 0$, the electron injection energy with respect to the conduction band bottom, $E_j$, is lowered. This reduces the probability of hole creation ($P_{ii}$) and thereby reduces the final energy of the holes, which, additionally, reduces the hole transmission probability ($T_h$).

If the dielectric-anode interface contains holes (for example p-channel in n-gate/p-channel, or p-channel in p-gate/p-channel) and the device has a high bandgap material anode adjacent to the dielectric layer instead of a silicon anode adjacent thereto, and, if $\Delta E_C > 0$, the electron injection energy with respect to the conduction band bottom, $E_j$, is lowered. This reduces the probability of hole creation ($P_{ii}$) and thereby reduces the final energy of the holes, which, in turn, reduces the hole transmission probability ($T_h$).

If the dielectric-cathode interface contains holes (for example p-gate in p-channel/p-gate device) and the device has a high bandgap material cathode adjacent to the dielectric layer instead of a silicon cathode adjacent thereto, then, when $\Delta E_V > 0$, the barrier to electrons tunneling from the valence band of the injection terminal layer is increased. Increasing this barrier lowers the total number of electrons incident on the anode ($I_e$). The electron injection energy with respect to conduction band bottom, $E_j$, is also lowered, thereby reducing the probability of hole creation ($P_{ii}$) and the final energy of the holes, which, in turn, reduces the hole transmission probability ($T_h$).

As previously noted, the present invention contemplates devices in which the electrode is a composite of a high bandgap material adjacent to the dielectric layer and a low bandgap material (e.g. doped silicon). In this embodiment, the device is advantageous over prior art devices in which the low bandgap material is adjacent to the dielectric. The advantage derives from the fact that, in the devices of the present invention, the holes that are produced in the low bandgap material cause less damage to the dielectric layer compared to the damage caused by holes produced in the low bandgap material in prior art devices. The damage efficiency of the holes is reduced because the holes lose energy due to scattering as they travel toward the dielectric material and through the high bandgap material, and thus their $T_h$ is reduced and, consequently, $I_h$ is lowered.

The high bandgap material has a bandgap that is greater than 1.1 eV. Examples of suitable high bandgap materials include silicon carbide (SiC), diamond and gallium nitride (GaN). The bandgap for SiC (the 4H form) is 3.2 eV. The bandgap for diamond is 5.5 eV and the bandgap for GaN is 3.5 eV. Comparing SiC with silicon, the $\Delta E_V$ is 0.2 eV and the $\Delta E_C$ is 2.0 eV.

Also, since the high bandgap material is an electrode, the high bandgap material must be capable of being doped in order to obtain the desired conductivity. Also, the high bandgap material is doped to achieve a single conductivity type (i.e. dominated by electrons or holes). The particular conductivity type will depend on the operating conditions of the device. In the embodiment of the present invention where the layer of high bandgap material, together with at least one other layer of material together form a composite electrode, the conductivity type is also restricted by the conductivity type in the other layer. Specifically, if the high bandgap material is adjacent to a doped, semiconductor electrode (e.g. doped, polycrystalline silicon) then the high bandgap material is the same conductivity type as the doped semiconductor. If the high bandgap material is adjacent to a metal electrode, then the conductivity type of the high bandgap material is not so restricted.

One skilled in the art will select the type of dopant and the amount of dopant for a particular device, and such selection is readily made by one skilled in the art. Also, one skilled in the art is readily able to select the manner (e.g. in situ dopant or implant) in which the dopant is introduced into the high bandgap material. For example, doping SiC with both n- and p-type dopants is described in Itoh, A, et al., "Single Crystal Growth of SiC and Electronic Devices," *Critical Reviews in Solid State and Materials Sciences*, Vol. 22, No. 2 (1997), which is hereby incorporated by reference.

A schematic cross-section of one embodiment of the device of the present invention is illustrated in FIG. 1. That device 10 is a MOSFET. The device is formed on a silicon substrate 12 that has source 14 and drain 16 regions formed therein. A layer of dielectric material 18 is formed on the substrate. The layer of dielectric material is a material that is susceptible to damage by hole penetration during device operation. One example of such a material is $SiO_2$.

A layer of a high bandgap material 20 is formed over the gate dielectric layer and is doped to provide the requisite conductivity. The high bandgap material is doped either in situ as the material is being formed on the gate dielectric layer or by implantation. The remaining portion of the gate 22 is formed over the layer of high bandgap material 20. Suitable gate structures for MOSFET devices are well known to one skilled in the art and are not described in detail herein. Tungsten silicide is one example of a suitable material for the remaining portion of the gate.

Figure 2A:
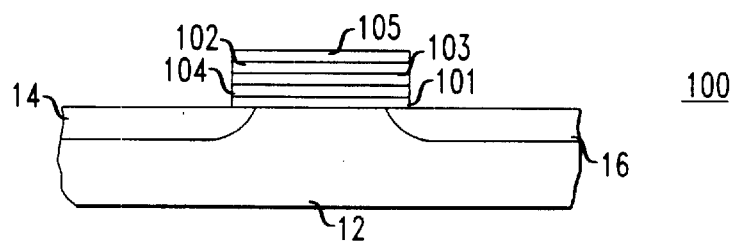
FIG. 2A is a schematic cross-section of a second embodiment of a device of the present invention.

A second embodiment of the present invention is illustrated in FIG. 2A. The device 100 depicted in FIG. 2A is a floating gate memory device. In this embodiment, the device 100 has a first dielectric layer 101 and a second dielectric layer 102. Layers 103 and 104 together are a composite electrode. Layer 103 is a layer of conductive, high bandgap material. Layer 104 is a layer of conductive material such as doped polysilicon. The high bandgap material layer 103 is adjacent the second dielectric layer 102. Thus, layer 102 is the layer that is protected from damage due to hole penetration by the presence of the high bandgap material layer 103. In this embodiment, a second gate 105 is formed over the second dielectric layer 102.

In an alternative embodiment, the layer 103 is the layer of conductive material. Layer 104 is the layer of conductive, high band gap material.

Figure 2B:
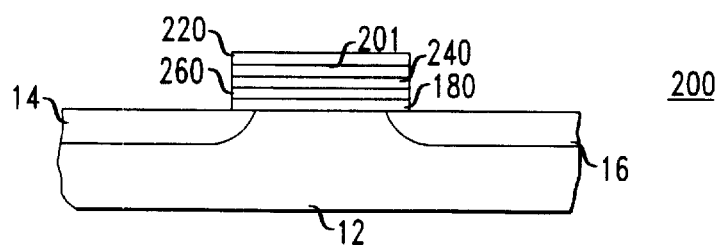
FIG. 2B is a schematic cross-section of a third embodiment of a device of the present invention.

A third embodiment of the present invention is illustrated in FIG. 2B. The device 200 depicted in FIG. 2B is a floating gate memory device. In this embodiment, the device has a first dielectric layer 180 and a second dielectric layer 240. Layer 201 is a layer of conductive, high bandgap material. Layer 260 is a layer of conductive material. The high bandgap material layer 201 is adjacent the second dielectric layer 240. Thus, layer 240 is the layer that is protected from damage due to hole penetration by the presence of the high bandgap material layer 200. The remaining portion of the gate 220 is formed over the high bandgap material layer 201.

Figure 2C:
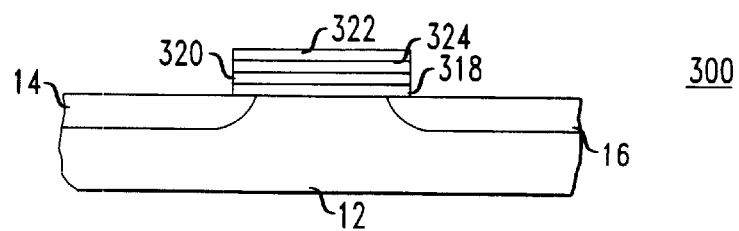
FIG. 2C is a schematic cross-section of a fourth embodiment of a device of the present invention.

A fourth embodiment of the present invention is illustrated in FIG. 2C. The device 300 depicted in FIG. 2C is a floating gate memory device. In this embodiment, the device has a first dielectric layer 318 and a second dielectric layer 324. Layer 320 is a layer of conductive, high bandgap material. The high bandgap material layer 320 is adjacent to the first dielectric layer 318 and to the second dielectric layer 324. Thus, either layer 318, layer 324, or both are protected from damage due to hole penetration by the presence of the high bandgap material layer 320 (depending on how the device is operated). In this embodiment a gate 322 is formed over the second dielectric layer 24.

The structures illustrated in FIGS. 2A–2C show the stacked dielectric/electrode/dielectric/electrode structure spanning the entire channel. The present invention is not limited to devices with this structure. For example, the present invention also contemplates split-gate devices in which the stacked dielectric/electrode/dielectric/electrode structure is formed over only a portion of the channel.

Figure 2D:
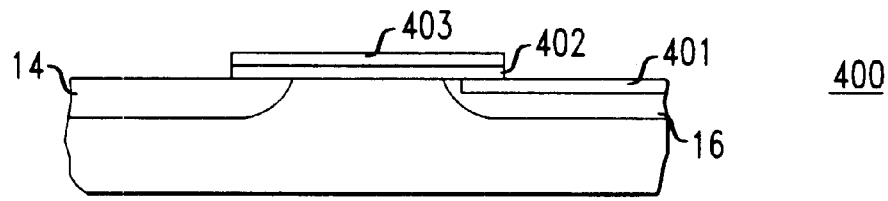
FIG. 2D is a schematic cross-section of a fifth embodiment of a device of the present invention.

Another embodiment of the present invention is illustrated in FIG. 2D. In this embodiment, the device 400 is a transistor in which the high bandgap electrode 401 is in the drain electrode 16. In this embodiment, the high bandgap material is doped to achieve a single conductivity type, and that conductivity type is the same as the conductivity type for the drain electrode 16. The high bandgap electrode 401 is adjacent the gate dielectric layer 402. The gate 403 of the device 400 is formed over the gate dielectric layer. In this embodiment, only the portion of the gate dielectric layer 402 in contact with the high bandgap material is protected from damage due to hole penetration.

An example of a processing sequence for fabricating the MOSFET device described in FIG. 1 is described below. One skilled in the art will appreciate that a variety of different processing sequences are useful for forming the devices of the present invention. The following sequence is provided for illustrative purposes, and is not intended to limit the scope of the invention in any way.

The device illustrated in FIG. 1 is formed by defining device regions in the substrate, i.e. doping the substrate to form source, drain and channel regions, and for forming insulating regions for device isolation. Such steps are well known to one skilled in the art and are not described in detail herein.

The device dielectric layer is formed on the substrate surface. The material for the device dielectric layer is any material that has suitable dielectric properties and is compatible with the overall process for device fabrication. Silicon dioxide ($SiO_2$) is by far the most common dielectric material used for the gate dielectric in processes for fabricating MOSFETs. As previously noted, other materials that are susceptible to hole damage are also contemplated as suitable.

The layer of dielectric material is formed on the substrate using conventional expedients well known to one skilled in the art. For example, if the dielectric material is $SiO_2$, the dielectric is formed by subjecting the substrate to an elevated temperature in the range of about 850° C. to about 1050° C. in an oxygen-containing atmosphere. Suitable conditions for forming $SiO_2$ of a desired thickness are well known to one skilled in the art.

After the layer of dielectric material is formed, a layer of high bandgap material is formed over the substrate. The deposition conditions will depend upon the material selected. For example if the material is a SiC film, the material may be deposited using the conditions described in Bassler, M., et al., "Interface State Density as Implanted 6H-SiC/$SiO_2$ MOS Structures," *Mater. Sci. Forum*, Vol. 264–268, Pt. 2, pp. 861–864 (1998). As previously noted, the high bandgap material is doped so that the material is sufficiently conductive.

In order for the high bandgap material, when functioning as an anode, to be effective in reducing hole damage, the thickness of the high bandgap material is at least several times the mean inelastic scattering distance for high energy electrons. The inelastic scattering distance is the distance than an electron travels before it loses energy. In order for the high bandgap material, when functioning as a cathode to be effective in reducing hole damage, the layer of high bandgap material is required to be at least several monolayers thick. The high bandgap material thickness is further selected so that it does not adversely affect device performance.

After the layer of high bandgap material is formed, the remaining portion of the gate stack is formed. The subsequent process sequence depends upon the desired gate stack. For example, in some embodiments subsequent layers of metal silicide or polysilicon are formed over the layer of high bandgap material. The processes and materials for forming the subsequent gate stack materials are conventional and are not described in detail herein.

Figure 3:
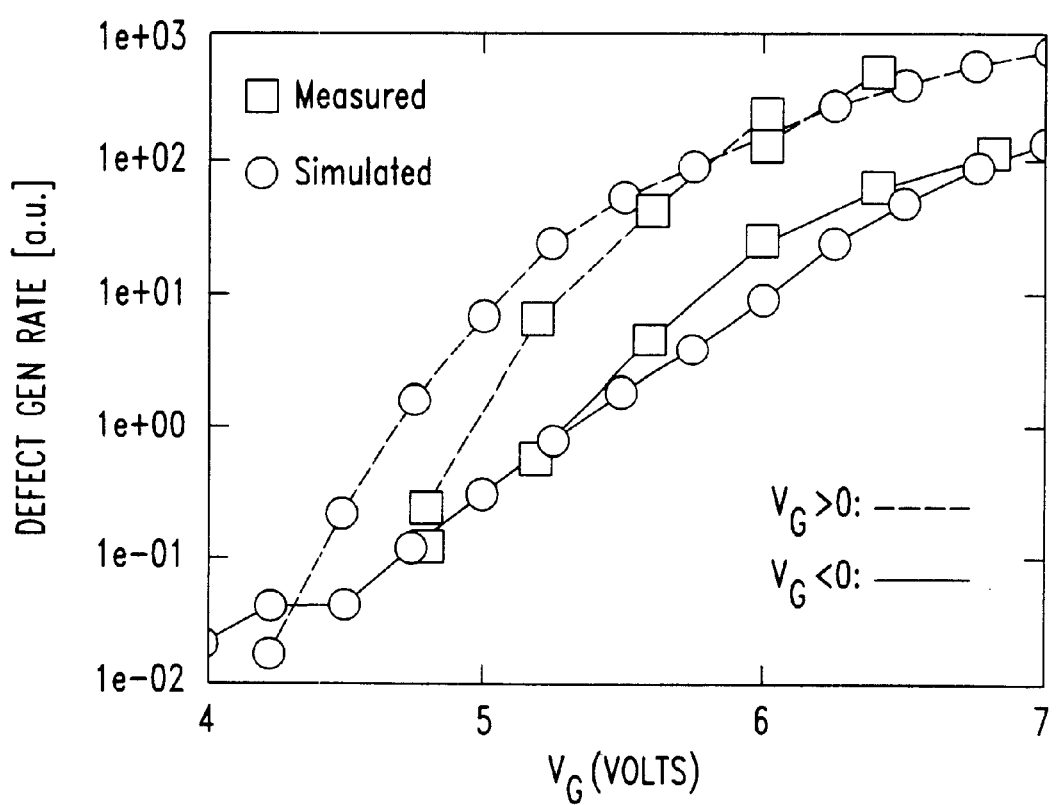
FIG. 3 is a comparison of simulated and measured damage generation rates in an $SiO_2$ gate dielectric layer as a function of gate voltage.

FIG. 3 illustrates the relationship between the rate of damage generation and the gate voltage applied to a capacitor. This capacitor had a 3.5 nm thick $SiO_2$ dielectric, an n-doped poly-silicon gate and a p-doped Si substrate. The measurements were provided in DiMaria, D, et al. *Appl. Phys. Lett.*, Vol. 68, p.3004 (1996). The simulations were performed with a physically-based simulator which computes hole current injection from the anode into the dielectric ($I_h$) as a function of voltage applied to the gate. These anode hole currents are computed following a similar model as described in equations (1) through (3) and share the same dependencies on $E_g$ and $E_f$ as described herein. This plot shows that dielectric damage is proportional to the anode hole current, and that the models presented in equations (1) through (3) provide an accurate assessment of this damage.

What is claimed is:

1. A semiconductor device comprising:
    a layer of dielectric material interposed between a first electrode and a second electrode, wherein a layer of high bandgap material is in contact with the layer of dielectric material and is at least a portion of either the first electrode or the second electrode, wherein the high bandgap material has a bandgap greater than 1.1 eV, and wherein the layer of high bandgap material is sufficiently doped to make the high bandgap material electrically conductive and wherein the high bandgap material is of a single conductivity type;
    wherein the device is a MOSFET and the dielectric layer is formed on a semiconductor substrate with source and drain regions formed therein, wherein the dielectric layer is formed on the semiconductor substrate and the layer of high bandgap material is formed on the dielectric layer;
    wherein the electrode with the layer of high bandgap material further comprises a second layer of material, wherein the second layer of material is selected from the group consisting of a doped semiconductor material and a metal;
    wherein the second layer of material is the doped semiconductor material and wherein the doped semiconductor material and the doped high bandgap material are the same conductivity type.

2. A semiconductor device comprising:
    a layer of dielectric material interposed between a first electrode and a second electrode, wherein a layer of high bandgap material is in contact with the layer of dielectric material and is at least a portion of either the first electrode or the second electrode, wherein the high bandgap material has a bandgap greater than 1.1 eV, and wherein the layer of high bandgap material is sufficiently doped to make the high bandgap material electrically conductive and wherein the high bandgap material is of a single conductivity type;
    wherein the device is a floating-gate memory device that has a first dielectric layer formed directly on a semiconductor substrate and a second dielectric layer interposed between a first electrode that is formed on the first dielectric layer and a second electrode that is in contact with the second dielectric layer, wherein at least the portion of the second electrode that is in contact with the second dielectric layer is the layer of electrically conductive, high bandgap material.

3. A semiconductor device comprising:
    a layer of dielectric material interposed between a first electrode and a second electrode, wherein a layer of high bandgap material is in contact with the layer of dielectric material and is at least a portion of either the first electrode or the second electrode, wherein the high bandgap material has a bandgap greater than 1.1 eV, and wherein the layer of high bandgap material is sufficiently doped to make the high bandgap material electrically conductive and wherein the high bandgap material is of a single conductivity type;
    wherein the device is a floating gate memory device that has a first dielectric layer formed directly on a semiconductor substrate and a second dielectric layer interposed between a first electrode that is formed on the first dielectric layer and a second electrode that is formed on the second dielectric layer, wherein the first electrode is a composite electrode having a first layer of a first material and a second layer of a second material and wherein the second layer is in contact with the second layer of dielectric material and is the layer of high bandgap material.

4. A semiconductor device comprising:
    a first layer of dielectric material interposed between a substrate and a first electrode and a second layer of dielectric material interposed between the first electrode and a second electrode, wherein a layer of high bandgap material is in contact with the first layer of dielectric material and is at least a portion of the first electrode, wherein the high bandgap material has a bandgap greater than 1.1 eV, and wherein the layer of high bandgap material is sufficiently doped to make the high bandgap material electrically conductive and wherein the high bandgap material is of a single conductivity type;
    wherein the device is a floating gate memory device and the first dielectric layer is formed directly on a semiconductor substrate with source and drain regions formed therein, wherein the dielectric layer is formed on the semiconductor substrate and the layer of high bandgap material is formed on the first dielectric layer; and
    wherein at least the portion of the first electrode that is in contact with the first dielectric layer is the layer of high bandgap material and wherein the first electrode further comprises a second layer of material, wherein the second layer of material is selected from the group consisting of a doped semiconductor material and a metal.

* * * * *